United States Patent
Zwadlo et al.

(10) Patent No.: US 9,205,638 B2
(45) Date of Patent: Dec. 8, 2015

(54) METHOD OF FORMING PRINTED PATTERNS

(71) Applicants: Gregory Lloyd Zwadlo, River Falls, WI (US); Elsie Anderson Fohrenkamm, St. Paul, MN (US); Charles W. Simpson, Lakeland, MN (US)

(72) Inventors: Gregory Lloyd Zwadlo, River Falls, WI (US); Elsie Anderson Fohrenkamm, St. Paul, MN (US); Charles W. Simpson, Lakeland, MN (US)

(73) Assignee: EASTMAN KODAK COMPANY, Rochester, NY (US)

( * ) Notice: Subject to any disclaimer, the term of this patent is extended or adjusted under 35 U.S.C. 154(b) by 162 days.

(21) Appl. No.: 14/150,118

(22) Filed: Jan. 8, 2014

(65) Prior Publication Data

US 2014/0216287 A1 Aug. 7, 2014

Related U.S. Application Data

(63) Continuation-in-part of application No. 13/759,092, filed on Feb. 5, 2013, now abandoned.

(51) Int. Cl.
*B41F 5/24* (2006.01)
*G03F 7/00* (2006.01)
*B82Y 10/00* (2011.01)
*B82Y 40/00* (2011.01)

(52) U.S. Cl.
CPC . *B41F 5/24* (2013.01); *B82Y 10/00* (2013.01); *B82Y 40/00* (2013.01); *G03F 7/0002* (2013.01)

(58) Field of Classification Search
CPC .......... B41F 5/24; B82Y 10/00; B82Y 40/00; G03F 7/0002
USPC .................................................. 101/483, 487
See application file for complete search history.

(56) References Cited

U.S. PATENT DOCUMENTS

| | | | |
|---|---|---|---|
| 4,590,144 A * | 5/1986 | Schornick et al. | 430/273.1 |
| 4,871,631 A * | 10/1989 | Pieper et al. | 430/14 |
| 5,407,708 A | 4/1995 | Lovin et al. | |
| 5,690,028 A | 11/1997 | Schick | |
| 5,752,442 A * | 5/1998 | Johnson et al. | 101/211 |
| 6,772,683 B2 | 8/2004 | Laksin et al. | |
| 7,026,012 B2 | 4/2006 | Chen et al. | |
| 7,799,504 B2 | 9/2010 | Zwadlo et al. | |
| 8,142,987 B2 | 3/2012 | Ali et al. | |
| 8,153,529 B2 | 4/2012 | Levy | |
| 8,168,546 B2 | 5/2012 | Levy | |

(Continued)

OTHER PUBLICATIONS

Shlomo Magdassi et al., "Nanomaterials for Printed Electronics," NIP 28 and Digital Fabrication 2012, 2012 Society for Imaging Science and Technology, pp. 561-563.

*Primary Examiner* — Mary Wilczewski
(74) *Attorney, Agent, or Firm* — J. Lanny Tucker

(57) ABSTRACT

A print material pattern is formed on a receiver element using an elastomeric relief element having a relief pattern. A printable material composition is applied only to the uppermost relief surface of the elastomeric relief element and at least at least 50 weight % of a carrier liquid is removed. A receiver element has a print material receptive layer having a dry thickness of 0.05-10 µm and is heated. During contact of the print material composition on the uppermost relief surface and the heated receiver element, the elastomeric relief element is compressed to provide sufficient contact with the receiver element. The elastomeric relief element is then separated from the heated receiver element to leave a pattern of the functional material on the heated receiver element, wherein at least 70 weight % of the original print material is transferred to the heated receiver element.

25 Claims, 1 Drawing Sheet

(56) References Cited

U.S. PATENT DOCUMENTS

| | | |
|---|---|---|
| 8,318,249 B2 | 11/2012 | Levy |
| 8,334,464 B2 | 12/2012 | Edwards et al. |
| 9,096,051 B1 * | 8/2015 | Fohrenkamm et al. ... B41F 5/24 |
| 2004/0003734 A1 | 1/2004 | Shively et al. |
| 2007/0289459 A1 | 12/2007 | Laksin et al. |
| 2008/0083484 A1 | 4/2008 | Blanchet et al. |
| 2008/0233280 A1 | 9/2008 | Blanchet et al. |
| 2008/0233489 A1 | 9/2008 | Blanchet et al. |
| 2009/0191356 A1 * | 7/2009 | Lee et al. ............... 427/535 |
| 2010/0077932 A1 | 4/2010 | Pekurovsky et al. |
| 2010/0215865 A1 * | 8/2010 | Keoshkerian et al. ........ 427/511 |
| 2011/0120543 A1 | 5/2011 | Levy |
| 2011/0120544 A1 | 5/2011 | Levy et al. |
| 2011/0244116 A1 | 10/2011 | Badre et al. |
| 2012/0237871 A1 | 9/2012 | Zwadlo |
| 2013/0319271 A1 * | 12/2013 | Sakamoto ............... 101/217 |
| 2014/0216287 A1 * | 8/2014 | Zwadlo et al. ............ 101/483 |
| 2015/0179310 A1 * | 6/2015 | Fohrenkamm et al. ............ H01B 13/0026 |
| 2015/0202859 A1 * | 7/2015 | Fohrenkamm et al. ... B42F 5/24 |

* cited by examiner

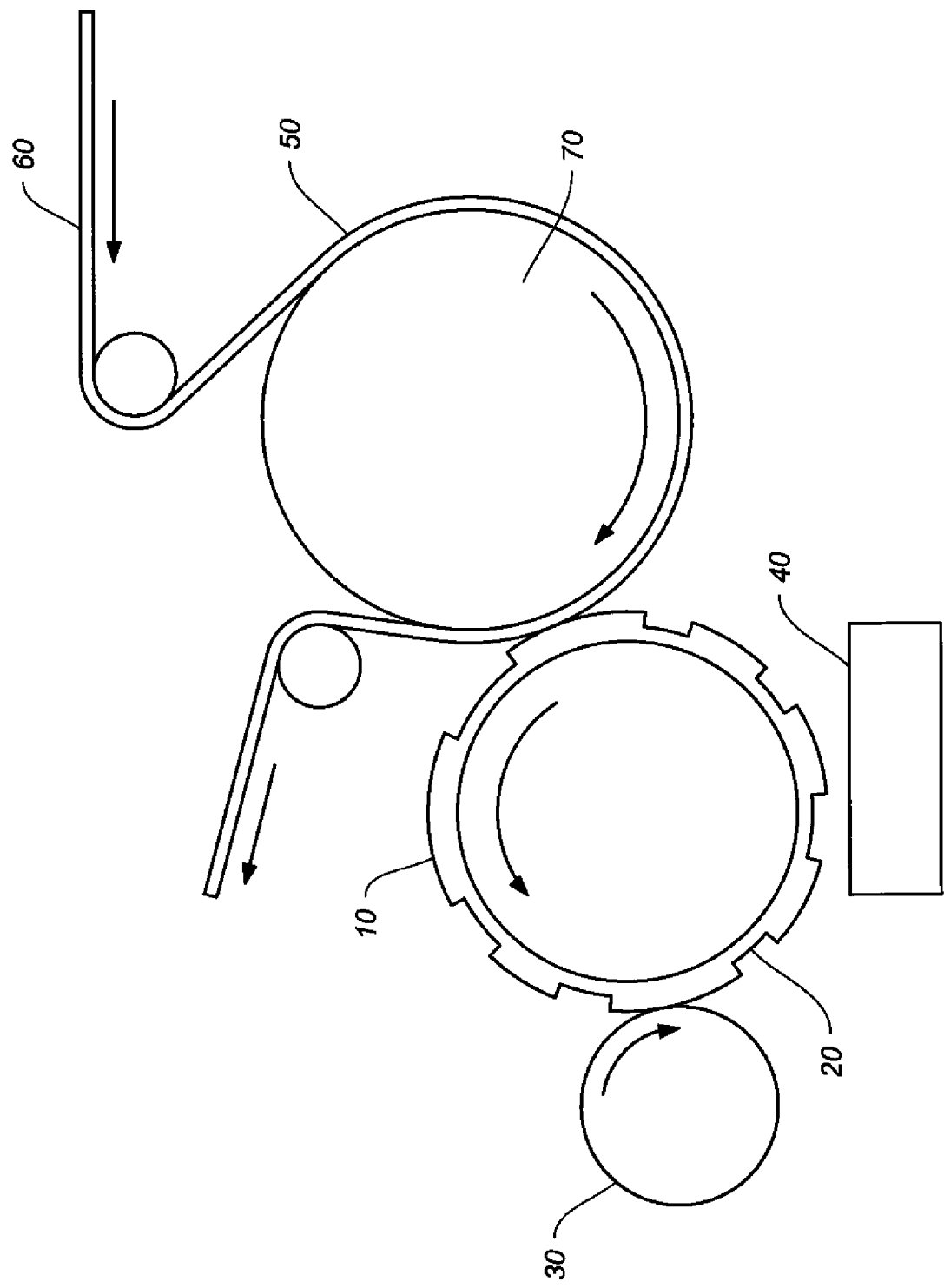

METHOD OF FORMING PRINTED PATTERNS

RELATED APPLICATION

This is a Continuation-in-part application of U.S. Ser. No. 13/759,092 filed Feb. 5, 2013 by Zwadlo, Fohrenkamm, and Simpson.

FIELD OF THE INVENTION

This invention relates to a method for forming or printing a print material in a printable material composition onto a suitable receiver element to provide a printed pattern. This printing method is carried out using an elastomeric relief element to apply (for example, laminate print) the print material in the printable material composition to a heated receiver element after at least some of the volatile carrier liquid is removed from the printable material composition.

BACKGROUND OF THE INVENTION

Relief images can be provided and used in various articles for many different purposes. For example, the electronics, display, and energy industries rely on the formation of coatings and patterns of conductive materials to form circuits on organic and inorganic substrates. Such coatings and patterns are often provided using relief imaging methods and relief image forming elements. There is also need for means to provide fine wiring in various articles.

Microelectronic devices have been prepared by photolithographic processes to form necessary patterns. Photolithography, however, is a complex, multi-step process that is too costly for the printing of electronic devices on plastic substances.

Contact printing is a flexible, non-lithographic method for forming patterned materials. Contact printing potentially provides a significant advance over conventional photolithographic techniques since contact printing can form relatively high resolution patterns for electronic parts assembly. Microcontact printing can be characterized as a high resolution technique that enables patterns of micrometer dimensions to be imparted onto a substrate surface. Contact printing is a possible replacement to photolithography in the fabrication of microelectronic devices, such as radio frequency tags (RFID), sensors, and memory and back panel displays. The capability of microcontact printing to transfer a self-assembled monolayer (SAM) forming molecular species to a substrate has also found application in patterned electroless deposition of metals. SAM printing is capable of creating high resolution patterns, but is generally limited to forming metal patterns of gold or silver for example using thiol chemistry. Although there are variations, in SAM printing a positive relief pattern provided on an element having a relief image is inked onto a substrate.

Flexography is a one method of printing or pattern formation that is commonly used for high-volume printing runs. It is usually employed for printing on a variety of soft or easily deformed materials including but not limited to, paper, paperboard stock, corrugated board, polymeric films, fabrics, metal foils, glass, glass-coated materials, flexible glass materials, and laminates of multiple materials. Coarse surfaces and stretchable polymeric films are economically printed using flexography.

Flexographic printing members are sometimes known as "relief" printing members (for example, relief-containing printing plates, printing sleeves, or printing cylinders) and are provided with raised relief images onto which ink is applied for application to a printable material. While the raised relief images are inked, the relief "floor" should remain free of ink. These flexographic printing precursors are generally supplied with one or more imageable layers that can be disposed over a backing layer or substrate. Flexographic printing also can be carried out using a flexographic printing cylinder or seamless sleeve having the desired relief image.

A method for printing with a conductive ink using a relief printing plate at high print speed is described in U.S. Patent Application Publication 2004/0003734 (Shively et al.).

U.S. Pat. No. 7,026,012 (Chen et al.) describes a method for transferring catalytic particles from a stamp to a substrate followed by plating the catalytic particles.

U.S. Patent Application Publication 2008/0233280 (Blanchet et al.) describes the use of an elastomeric stamp having a relief structure with a raised surface that is treated with heat or by other means to enhance its wettability, and then application and transfer of a functional material to form a pattern on a substrate.

While there are numerous methods described in the art to form patterns using relief images, there remains a need to find a way to consistently provide patterns with high resolution lines (for example, 10 µm or less) and feature uniformity using various printable material compositions (or what are sometimes known as "inks"). The industry has been pursuing these goals for many years with limited success and continued research is being done to achieve these goals using a wide variety of print materials. A number of problems must been addressed to achieve the desired high resolution lines.

One problem is the spread of the viscous printable material composition (or ink) during compression contact between an elastomeric relief element and a substrate (receiver element). This results in a loss of resolution and uniformity of edge quality.

A second problem that has been observed is the limited amount of print material composition that can be applied to and subsequently transferred from an elastomeric relief element to a substrate (receiver element). Typically, only about half of the printable material composition is transferred to the substrate when the printable material composition still contains volatile carrier liquid or is too viscous. Thus, in such instances, insufficient printable material composition is transferred to the substrate to meet performance requirements.

Yet another problem that must be addressed is the potential incompatibility of the carrier liquid with an elastomeric relief element as well as the receiver material.

Lastly, another problem to be addressed is the low impression pressure between the elastomeric relief element and the substrate that is typically needed to provide sufficient wet transfer of both fine features and large area features. Typically, multiple printing steps from multiple elastomeric relief elements are required to provide both fine features and large solid area features because of this problem.

There is a desire to address as many of these problems using the same printing method.

SUMMARY OF THE INVENTION

The present invention provides a method for forming a pattern of a print material on a receiver element comprising a print material receptive layer, the method comprising:

providing an elastomeric relief element that comprises a relief pattern comprising (1) an uppermost relief surface, and (2) an average relief image depth of at least 50 µm relative to the uppermost relief surface and a shoulder angle greater than 25° and up to and including 85° from vertical, and (3) a modulus of elasticity of at least 2 megaPascals and up to and including 10 megaPascals, applying a printable material composition to the uppermost relief surface of the elastomeric relief element, the printable material composition comprising a print material and a carrier liquid, the printable material composition having a viscosity of at least 1 cps and up to and including 1500 cps, removing at least 50 weight % of the carrier liquid from the printable material composition that is disposed on the uppermost relief surface of the elastomeric relief element, leaving print material disposed on the uppermost relief surface, providing a receiver element comprising a print material receptive layer disposed on a substrate, wherein the print material receptive layer has a dry thickness of at least 0.05 μm and up to and including 10 μm when measured at 25° C., heating the receiver element to a heating temperature that is higher than the glass transition temperature ($T_{gl}$) of the print material receptive layer, to form a heated receiver element, contacting the print material disposed on the uppermost relief surface and the heated receiver element such that the elastomeric relief element (not supporting means such as mounting tape) is compressed and the print material disposed on the uppermost relief surface is in contact with the heated receiver element, and separating the elastomeric relief element from the heated receiver element to leave a pattern of the print material on the heated receiver element, wherein at least 70 weight % of the print material originally disposed on the uppermost relief surface of the elastomeric relief element is transferred to the heated receiver element.

In addition, in some embodiments of this invention, a method for forming a pattern of a print material on a receiver element comprising a print material receptive layer, comprises:

providing an elastomeric relief element that comprises a relief pattern comprising (1) an uppermost relief surface, and (2) an average image depth of at least 50 μm relative to the uppermost relief surface and a shoulder angle greater than 25° and up to and including 85° from vertical, and (3) a modulus of elasticity of at least 2 megaPascals and up to and including 10 megaPascals, applying a printable material composition to the uppermost relief surface of the elastomeric relief element, the printable material composition comprising a print material and a carrier liquid, the printable material composition having a viscosity of at least 1 cps and up to and including 1500 cps, removing at least 25 weight % of the carrier liquid from the printable material composition that is disposed on the uppermost relief surface of the elastomeric relief element, leaving print material disposed on the uppermost relief surface, repeating the preceding applying and removing steps together, in the noted sequence, at least once using additional amounts of the same printable material composition and the same elastomeric relief element, to provide an increased amount of print material disposed on the uppermost relief surface, providing a receiver element comprising a print material receptive layer disposed on a substrate, wherein the print material receptive layer has a dry thickness of at least 0.05 μm and up to and including 10 μm when measured at 25° C., heating the receiver element to a heating temperature that is higher than the glass transition temperature ($T_{gl}$) of the print material receptive layer, to form a heated receiver element, contacting the print material disposed on the uppermost relief surface and the heated receiver element such that the elastomeric relief element (not mounting means such as mounting tape) is compressed by at least 10 μm of its original thickness, and the increased amount of print material disposed on the uppermost relief surface is in contact with the heated receiver element, and separating the elastomeric relief element from the heated receiver element to leave a pattern of the print material on the heated receiver element, wherein at least 70 weight % of the print material originally disposed on the uppermost relief surface of the elastomeric relief element is transferred to the heated receiver element.

In still other embodiments, the method of this invention comprises the following conditions, all of which are defined in more detail below:

removing at least 75 weight % of the carrier liquid from the printable material composition on the uppermost relief surface of the elastomeric relief element, transferring at least 90 weight % of the print material originally disposed on the uppermost relief surface of the elastomeric relief element to the heated receiver element, and contacting the print material disposed on the uppermost relief surface and the heated receiver element, wherein the print material receptive layer has a dry thickness of at least 0.05 μm and up to and including 3 μm when measured at 20° C., wherein the flexographic printing member has a modulus of elasticity of at least 4 megaPascals to and including 8 megaPascals, and wherein the printable material composition comprises a print material that comprises nanoparticles of an electrically conductive material selected from the group consisting of silver, gold, copper, palladium, indium-tin oxide, or combinations thereof.

The method of this invention provides a number of advantages for what is known as "functional printing". For example, the method provides a means for obtaining high resolution printed patterns on various substrate (or receiver elements) using print materials that are not previously useful to achieve such results. The high resolution line features in a printed pattern are obtained by a unique series of operations including removal of at least some of the liquid used to uniformly disperse and "carry" the print material in a printable material composition on an elastomeric relief element that is used as the printing element. The more viscous or cohesive printable material composition is then transferred to a heated receiver element before the elastomeric relief element is separated from the heated receiver element. The elastomeric relief element used for this transfer can be provided in a variety of ways (described below) including but not limited to, the use of flexographic printing elements.

In some embodiments, it is possible to build up the print material on the elastomeric relief element before the pattern is formed on the heated receiver element. This can be done by multiple applications of the printable material composition to the uppermost relief surface of the elastomeric relief element, and removal of at least some of the carrier liquid from the printable material composition. This drier or more viscous, cohesive, and increased amount of printable material composition can be applied to the heated receiver element to provide several advantages.

For example, multiple applications of the printable material composition, with carrier liquid removal between applications, can increase conductivity or other properties of the eventual printed image beyond what can be obtained with a single application due to the additional quantity of print material. In some instances, the print material has limited dispersibility in the carrier liquid and thus multiple applications are needed to get sufficient density or thickness of the print material in the printed image on the heated receiver element.

Inking systems such as high ink volume Anilox rollers cannot always be used to apply sufficient printable material composition without leaving residue of the composition on the sides of the elastomeric relief element due to spread of the printable material composition (or ink) onto the sides of the elastomeric relief element feature sides. This problem can be minimized by multiple applications of the printable material composition to the elastomeric relief element, such as by use of a low volume Anilox roller.

In addition, compression contact of the elastomeric relief element and a heated receiver element can cause significant spread of the wet printable material composition away from the contact area between the two elements and a corresponding undesirable increase in image features (known as print gain). However, this problem can also be diminished by multiple applications of the printable material composition to the elastomeric relief element (with appropriate removal of carrier liquid between applications). Each application of the printable material composition can be relatively thin, but the multiple applications appropriately build up dry thickness on the elastomeric relief element, and the resulting printed image can have desired properties such as conductivity. The built-up dry and cohesive printable material composition on the elastomeric relief element does not spread during the subsequent compression contact between the two surfaces. The intervening drying steps can also provide desired registration of the printable material composition as sequential contact printing steps are not required to build up printable material composition thickness.

BRIEF DESCRIPTION OF THE DRAWING

FIG. 1 is a schematic illustration of one embodiment of an equipment system for carrying out the present invention, as described in the Examples below.

DETAILED DESCRIPTION OF THE INVENTION

Definitions

As used herein to define various components of the printable material compositions, formulations, and elastomeric compositions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, percentages refer to percents by total dry weight, for example, weight % based on total solids of a layer, composition, or formulation. Unless otherwise indicated, the percentages can be the same for either the dry layer or the total solids of the formulation or composition used to make that layer.

The term "flexographic printing precursor" refers to some embodiments of elastomeric relief elements useful in the practice of this invention. The flexographic printing precursors include flexographic printing plate precursors, flexographic printing sleeve precursors, and flexographic printing cylinder precursors, all of which can be suitably imaged to provide a relief image to have an average relief image depth of at least 50 μm and up to and including 1000 μm, or at least 100 μm and up to and including 600 μm, relative to the uppermost relief surface. Any desired minimum and maximum relief image depths can be achieved based on a given elastomeric relief element and the printed pattern that is desired. Such elastomeric relief elements can also be known as "flexographic printing plate blanks", "flexographic printing cylinder blanks", or "flexographic sleeve blanks". The elastomeric relief elements can also have seamless or continuous forms.

The term "laser-engraveable" means that a layer can be directly imaged using a suitable laser-engraving source including carbon dioxide lasers and near-infrared radiation lasers such as Nd:YAG lasers, laser diodes, and fiber lasers. Absorption of energy provided by these lasers produces heat that causes rapid local changes in a laser-engraveable layer so that the imaged regions are physically detached from the rest of the layer or substrate and ejected from the layer and collected using suitable means. Non-imaged regions of the laser-engraveable layer are not removed or volatilized to an appreciable extent and thus form the uppermost relief surface in the printing surface for printing. The breakdown is a violent process that includes eruptions, explosions, tearing, decomposition, fragmentation, oxidation, or other destructive processes that create a broad collection of solid debris and gases. This is distinguishable from, for example, image transfer. "Laser-ablative" and "laser-engraveable" can be used interchangeably in the art, but for purposes of this invention, the term "laser-engraveable" is used to define imaging in which a relief image is formed in the elastomeric relief element. It is distinguishable from image transfer methods in which ablation is used to materially transfer pigments, colorants, or other image-forming components.

Uses

The method of this invention can be used in many ways to form a pattern of a print material on a suitable receiver element (or substrate) for use in devices and for components in a variety of applications including but not limited to, electronic, optical, sensory, and diagnostic devices. More details of such uses are provided below. A variety of active and inactive materials useful as the print material can be applied to the receiver material using a suitable elastomeric relief element described herein. In particular, it is desired to use the present invention to provide patterns of print materials on heated receiver elements comprising lines having a line resolution (line width) of less than 50 μm, or less than 15 μm, or even less than 10 μm and as low as 1 μm.

Such electronic and optical devices and components include but are not limited to, radio frequency tags (RFID), sensors, and memory and back panel displays. The method of this invention can be used to form patterns of electrically conductive materials, semi-conductive materials, dielectric materials, and colorants (dyes or pigments). The patterns can be designed to be temperature-sensitive or pressure-sensitive as well.

For example, the method of this invention can be used to form suitable patterns of biological materials and pharmacologically active materials on a receiver element for use in sensory or diagnostic applications. The method can also form the print material into a suitable pattern that forms barrier walls for cells or pixels to contain other materials, such as light emitting materials or color filter pigmented materials, or to form a pattern that defines the channel length between source electrode and drain electrode delivered from solution. The pattern of barrier walls can also be referred to as a confinement layer or barrier layer. The method of this invention can be used to form a print material into a pattern that forms barrier walls that create cells for use as color filter pixels that can be filled with colorants for color filters, including dye and pigment colorants.

The present invention can also be used to form a pattern of a print material into transistor channels for top gate devices in which other materials, such as source materials and drain materials, are delivered to the channels. The method can form the print material into transistor channels on a semiconducting layer of the receiver element for bottom gate devices in which source materials and drain materials are delivered to the channels. The other materials can be delivered into patterned cells on a receiver element by any means including ink jetting.

The present invention is also useful for providing electrically conductive patterns on receiver elements that are designed for use as touch panel displays. Such electrically conductive patterns can be provided using print materials, such as metals and metallic salts that are or can be processed or treated in some manner to become electrically conductive. Useful print materials of this type include but are not limited to, silver and silver salts such as silver halides, and silver behenate and other organic silver salts.

Print Materials and Printable Material Compositions

In some embodiments, the term "print material" refers to a material that is capable of facilitating an operation in a component or device. In addition, a print material can be a material that can be used for providing visual information as well as purposes other than simply providing visual information. The print material can be an active or inactive material, and can be organic or inorganic in nature. Organic materials can be polymeric materials or non-polymeric small molecules, or oligomeric materials that are considered to be in between polymeric materials and non-polymeric small molecules.

"Active print materials" include but are not limited to, electrically active materials, photoactive materials, and biologically active materials. As used herein, the terms "electrically active", "photoactive", and "biologically active" refer to print materials that exhibit a predetermined activity in response to a stimulus such as an electromagnetic field, an electrical potential, solar or other energy radiation, a bio-stimulation field, or any combination thereof.

"Inactive print materials" include but are not limited to, insulating materials such as dielectric materials, planarization materials, barrier materials, and confinement materials. For example, a planarization material can be printed on top of a pattern of pixels in color filters to render all pixels the same height. A bather material is a printed pattern that forms a barrier so that charges in the cathode facilitate charge injection into a light emitting polymer layer in an organic light emitting diode (OLED). A confinement material can be printed as a pattern that restricts the expansion of a subsequently applied liquid to a particular area that is defined by the pattern of confinement material.

Print materials include for example, electrically conductive materials, semi-conductive materials, and dielectric materials. Examples of electrically conductive materials include but are not limited to, conductive polymers, nanoparticles of indium-tin oxide metals such as gold, silver and silver precursors, copper, and palladium, metal complexes, metal alloys, and combinations thereof. A print material can alternatively be a conductive material precursor such as a metal salt (for example a silver salt like a silver halide or an organic silver salt), or an electroless metallization catalyst such as palladium particles. Examples of useful electrically semi-conductive inorganic materials include but are not limited to silicon, germanium, gallium arsenide, zinc oxide, and zinc selenide, and combinations thereof.

Examples of useful electrically semi-conductive organic materials that can be used as print materials include N,N'-di(arylalkyl)-substituted naphthalene-based tetracarboxylic diimide compounds as described for example in U.S. Pat. No. 7,981,719 (Shukla et al.), N,N'-cycloalkyl-substituted naphthalene-based tetracarboxylic diimide compounds as described for example in U.S. Pat. No. 8,212,243 (Shukla et al.), and compositions also containing polymer additives as described for example in U.S. Patent Application Publication 2011-0183462 (Shukla et al.), the disclosures of all of which are incorporated herein by reference.

In addition, the photocurable inks described in U.S. Patent Application Publication 2012-0207935 (Shukla et al.), the disclosure of which is incorporated herein by reference, can be used as print materials.

Useful print materials can also be compositions that can be polymerized by photoinitiation such as those described in U.S. Patent Application Publication 2012-0122664 (Shukla et al.), the disclosure of which is incorporated herein by reference.

Further, useful "precursor" print materials are amic acid or amic acid ester compositions as described for example in U.S. Patent Application Publication 2011-0269967 (Shukla et al.) the disclosure of which is incorporated herein by reference.

Print materials can be of any form including particulate, polymeric materials, small molecule materials, and other forms that would be apparent to a skilled worker. For example, useful electrically semi-conductive materials and dielectric materials can be used as particulate print materials. Useful particulate or film-forming polymeric print materials include electrically conductive polymers including but not limited to, homopolymers and copolymers comprising polythiophenes, polyanilines, polypyrroles, polycarbazoles, polyindoles, polyazepines, polyethylenedioxythiophenes, poly(3-alkylthiophenes), poly(p-phenylene vinylene)'s, poly(p-phenylene)'s, poly(styrene sulfonic acid) (PSS), polyp-phenylene sulfide), polyacetylene, poly(3,4-ethylene dioxythiophene) (PEDOT), and a mixture of poly(styrene sulfonic acid) and poly(3,4-ethylene dioxythiophene) (PSS:PEDOT).

It is also possible that the print materials are nanoparticles of electrically conductive, electrically semi-conductive, and dielectric materials. Nanoparticles are microscopic particles whose size is measured in nanometers (nm). Nanoparticles include particles having at least one dimension less than 200 nm and in some embodiments, the nanoparticles have an average diameter of at least 3 nm to and including 100 nm. The nanoparticles can be in the form of clusters. The shape of the nanoparticles is not limited and includes nanospheres, nanorods, and nanocups. Nanoparticles composed of electrically semi-conductive materials can also be known as quantum dots if the particles are small enough (usually less than 30 nm) that quantization of electronic energy levels occurs. Electrically conductive semi-conductive materials include light-emitting quantum dots. The print materials include but are not limited to, semi-solid nanoparticles such as liposomes, soft nanoparticles, nanocrystals, and hybrid structures, such as core-shell nanoparticles. Moreover, the print materials also include nanoparticles of carbon such as carbon black, carbon nanotubes, electrically conducting carbon nanotubes, graphene, carbon black conducting polymers, and electrically semi-conducting nanotubes. Metal nanoparticles and dispersions of gold, silver, and copper are also useful in this invention.

The term "photoactive" print material is intended to mean any print material that exhibits photoluminescence, electroluminescence, or photosensitivity. The term is intended to include at least dyes, optical whiteners, photoluminescent materials, compounds reactive to actinic radiation, and photoinitiators. For example, a photoactive print material can be a material or combination of materials that are capable of initiating one or more reactions, particularly photochemical reactions, upon response to suitable ultraviolet, visible, or infrared radiation. Photoactive print materials can include compounds that can be reactive to radiation or a composition comprising one or more compounds, such as monomers and photoinitiators that render the composition reactive to the radiation.

Further examples of print materials can be referred to as small molecules and include but are not limited to, organic dyes, electrically semi-conducting molecules, fluorescent chromophores, phosphorescent chromophores, pharmacologically active compounds, biologically active compounds, silver halide compositions, and compounds having catalytic activities, that alone or in various combinations with other materials, are suitable for the fabrication of patterned devices useful for electronic, sensory, or diagnostic applications.

Biologically active print materials, which can also be called bio-based materials, for use in the present invention can include but are not limited to, deoxyribonucleic acids (DNA's) of various molecular weights that can be used as templates or scaffolds to position other materials that bind to DNA into well-defined geometries, and proteins, poly(oligo) peptides, and poly(oligo)saccharides, that alone or in various combinations with other materials, are suitable for the fabrication of patterned devices for electronic, sensory, or diagnostic application.

Thus, in many embodiments, the printable material composition used in this invention comprises a print material that is selected from the group consisting of electrically conductive materials, semi-conductive materials, dielectric materials, small molecule materials, polymeric materials, bio-based materials, electro luminescence materials, and combinations thereof.

More particularly, the printable material composition used in this invention comprises a print material that comprises nanoparticles of an electrically conductive material selected from the group consisting of silver or silver precursor, gold, copper, palladium, indium-tin oxide, or combinations thereof. For example, in some very useful embodiments, the printable material composition comprises a print material that comprises nanoparticles of an inorganic or organic silver salt such as a silver halide, silver behenate, and other silver salts that would be readily apparent to one skilled in the art.

It has been found particularly useful to use printable material compositions comprising a print material that comprises nanoparticles of silver metal using an elastomeric relief element (described below) that is a flexographic printing member such as a flexographic printing plate.

In other embodiments, the print material is a colorant including but not limited to, dyes, optical absorbers, pigments, opacifiers, and any material that modifies the transmissive or reflective property of a surface onto which it has been applied.

In general, one or more print materials can be dispersed, dissolved, or suspended in a suitable carrier liquid, forming a printable material composition for application to a receiver material using the elastomeric relief element described herein. The carrier liquid used for the printable material composition is not limited and can include organic compounds and aqueous compounds. For example, the carrier liquid can be an organic compound that is an alcohol-based compound. The carrier liquid can be a solvent that is capable of dissolving another substance such as one or more print materials to form a uniform solution, or it can be a compound capable of dispersing or suspending the print material in solution sufficient to carry out the method of this invention.

The carrier liquid and the print material should at least be capable of wetting at least the uppermost relief surface of the elastomeric relief element during the method of this invention. The carrier liquid can have some volatility, and can also cause a certain amount of swelling in the elastomeric relief element, depending upon the type of composition from which the elastomeric relief element is prepared. Any swelling in the elastomeric relief element can be reduced when the carrier liquid is removed from the printable material composition. In addition, it is advantageous to use a carrier liquid that will not attack or adversely affect the stability and dimensional size of the elastomeric relief element or receiver element. A skilled worker can readily make a judicious choice of carrier liquid depending upon the materials used for the elastomeric relief element and the receiver element, and the particular print material to be printed (is swellability, solubility and other desired properties).

The carrier liquid can also include one or more compounds as a solvent for the print material. For example, the carrier liquid can include one or more solvents for the print material. In other embodiments, the carrier liquid comprises two or more solvents, for example a co-solvent mixture, for the print material. The solvent mixtures can be chosen using various criteria such as the evaporation rate (volatility) of the individual solvents, and the solvating power of the individual solvent components for a particular print material. Further details of such solvents are provided in paragraph [0046] of U.S. Patent Application 2008/0233280 (noted above) the disclosure of which is incorporated herein by reference.

Representative useful carrier liquid solvents include but are not limited to, alcohols (such as isopropyl alcohol, 2-ethyl hexanol, and α-terpenol), acetates (such as ethyl acetate), water, hydrocarbons (such as toluene and cyclohexane), and combinations of miscible solvents.

In general, the printable material composition comprising the carrier liquid and print material has a viscosity of at least 1 cps and up to and including 1500 cps, or typically of at least 200 cps and up to and including 900 cps, or up to and including 1000 cps. Some highly viscous printable material compositions can be used in the practice of this invention, and have a viscosity of at least 1500 cps to and including 5000 cps. Viscosity can be measured using a conventional means and equipment such as a Brookfield Viscometer DV-II+Pro (Brookfield Engineering Laboratories).

Some particularly useful print materials include but are not limited to, electrically conductive inks containing electrically conductive particles such as metal flakes or particles. Electrically conductive inks include electrically conductive silver-containing inks, gold-containing inks, copper-containing inks, carbon-containing inks, palladium-containing inks, and inks containing "seed" materials for electroplating or electroless plating. Some of such inks can be obtained commercially from sources such as InkTec (California), Flint Ink Corporation (Michigan), and Method Development Company (Chicago). Some of these "inks" can be used as a carrier liquid while other inks comprise both a carrier liquid and a print material. It is also possible to use print materials that contain UV-curable components.

Thus, such printable material compositions (or "inks") can comprise print materials that are dissolved or suspended in suitable carrier solvents as described above and that are known in the art for this purpose. For example, a silver-containing electrically conductive printable material composition can include any useful amount of silver metal particles that are dispersed in aqueous or non-aqueous carrier solvents.

Elastomeric Relief Elements

The elastomeric relief elements used in this invention can be comprised of one or more elastomeric layers, with or without a substrate, in which a relief image can be generated using suitable imaging means. For example, the relief layer comprising a relief pattern can be disposed on a suitable substrate.

For example, the elastomeric relief element (for example, flexographic printing member) having a relief layer comprising an uppermost relief surface and an average relief image depth (pattern height) of at least 50 μm, or typically having an average relief image depth of at least 100 μm relative to the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of which are incorporated herein by reference. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. Other useful materials and image formation methods (including development) for provide elastomeric relief images are also described in the noted Ali et al. patent.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.) the disclosures of which are all incorporated herein by reference.

However the relief image is provided, its elastomeric relief layer is designed such that the elastomeric relief element has a modulus of elasticity of at least 2 megaPascals but less than 10 megaPascals, or typically of at least 4 megaPascals and up to and including 8 megaPascals, as determined for example, using a Digital Durometer HPE-II Series (Qualitest USA LC), Instron Model 5942 Single Column Table Top Materials Testing System, Texture Technologies TA-XT2i Benchtop Materials Tester, or Rheometrics Solids Analyzer Model RSAII DMA, particularly when the elastomeric relief element is a flexographic printing member. The relationship between Shore A hardness (indentation) and Young's Modulus is described by A. N. Gent, "On the Relation between Indentation Hardness and Young's Modulus", *Rubber Chemistry and Technology*: September 1958, Vol. 31, No. 4, pp. 896-906, 1958.

As noted above, average relief image depth (relief pattern) or an average relief pattern height in the relief pattern is at least 50 μm or typically at least 100 μm relative to the uppermost relief surface. A maximum relief image depth (relief pattern) or relief pattern height can be as great as 1,000 μm, or typically up to and including 750 μm, relative to the uppermost relief surface. The relief pattern generally has a shoulder angle of greater than 25° and up to and including 85°, or typically at least 50° and up to but less than 75°, relative to a vertical line from the lowest recess to the uppermost relief surface (that is, the higher should angle of 85° would be closer to the horizontal dimension parallel with the uppermost relief surface). Shoulder angle can be measured as described in FIG. 4 of U.S. Pat. No. 7,799,504 (noted above) the disclosure of which is incorporated herein by reference for this purpose.

Methods for Forming Patterns

The method of this invention uses the elastomeric relief element described herein to print a suitable pattern of a print material on a receiver element. The present invention enables printing of a variety of print materials over relatively large areas with desirable resolution (for example, a line width of less than 20 μm or even less than 15 μm). In some embodiments, where the print material is an electrically conductive functional material, the resolution (line width) can be as low as 5 μm or even as low as 1 μm. The method also provides a means for printing of sequential overlying patterns without hindering the utility of one or more underlying layers. The method can be adapted to high-speed production processes for the fabrication of electronic devices and components.

Printable material compositions containing the print material can applied in a suitable manner to the uppermost relief surface (raised surface) in the elastomeric relief element. Application of the printable material composition can be accomplished using several suitable means and it is desirable that as little as possible is coated onto the sides (slopes) or recesses of the relief depressions. Thus, it is desirable that as much as possible of the printable material composition is applied only to the uppermost relief surface. Anilox roller systems or other roller application systems, especially low volume Anilox rollers, below 2.5 billion cubic micrometers per square inch (6.35 billion cubic micrometers per square centimeter) and associated skive knives are used in flexographic printing presses are particularly advantageous for this application of the printable material composition. Spin coating techniques and dip coating techniques are generally not suitable for this application because the printable material composition can be spread onto the sides of the elastomeric relief element relief features and even onto the floor or non-printing areas of the elastomeric relief element. Optimum metering of the printable material composition onto the uppermost relief surface only can be achieved by controlling the printable material composition viscosity or thickness, or choosing an appropriate application means.

As noted above, the printable material composition can have a viscosity during this application of at least 1 cps (centipoise) and up to and including 1500 cps, or at least 1 cps and up to and including 1000 cps.

The printable material composition can be applied at any time after the relief image is formed within a relief element precursor. The printable material composition can be applied by any suitable means, including the use of an Anilox roller system, which can be one of the most useful ways for application to the uppermost relief surface. The thickness of the functional material composition on the relief image is generally limited to a sufficient amount that is readily be transferred to the heated receiver element but not too much to flow over the edges of the relief element in the recesses when the functional material composition is applied to the relief element.

After the printable material composition has been applied to the uppermost relief surface (or raised surface) of the relief element, at least 25 weight % of the original carrier liquid is removed from the printable material composition on the uppermost relief surface of the elastomeric relief element. In most embodiments, at least 50 weight % of the carrier liquid is removed from the printable material composition on the uppermost relief surface of the elastomeric relief element, or typically at least 75 weight %, or even at least 80 weight %, of the carrier liquid is removed. Thus, the carrier liquid of the printable material composition can be removed sufficiently to form a film of the functional material on at least the uppermost relief surface of the relief image. Carrier liquid removal can be achieved in any manner, for example using jets of hot air, evaporation at room temperature, or heating in an oven at an elevated temperature, or other means known in the art for removing a solvent. In one embodiment, the liquid can be removed by drying during the application of the printable material composition to the uppermost relief surface. Effective drying can be assisted by selecting a carrier solvent(s) that has a relatively low boiling point or by application of a thinner layer of the printable material composition.

In some embodiments, the cycle of a) applying the printable material composition to the uppermost relief surface of the elastomeric relief element, and b) removing at least 25 weight % (or at least 50 weight %) of the carrier liquid from the printable material composition, in this sequence, can be repeated at least once, using an additional amount of the same printable material composition and the same elastomeric relief element, in each cycle. This disposes an increased amount of print material on the uppermost relief surface, and increases the optical density of the resulting pattern of print material on the heated receiver element, for example to provide an average density of at least 3.5 as measured by an X-Rite 360 spectrophotometer, or increases the electrical conductivity of the resulting pattern. The repetition of the noted sequence of action also maintains printed feature resolution and continuity while filling any potential voids in the desired printed regions of the pattern. There can be sufficient time between multiple applications of printable material composition so that sufficient amounts of carrier liquid can be removed using any suitable means of solvent removal as described above.

A receiver element is provided on which a desired pattern is formed using the elastomeric relief element. This receiver element can be composed of any suitable material including but are not limited to, polymeric films, metals, silicon or ceramics, fabrics, papers, and combinations thereof (such as laminates of various films, or laminates of papers and films) provided that a pattern of a print material can be formed thereon. The receiver element can be transparent or opaque, and rigid or flexible. The receiver element can include one or more polymeric or non-polymeric layers or one or more patterns of other materials before the pattern of print material is applied according to the present invention. The surface of the receiver element can be treated for example with a primer layer or mechanical treatments (such as graining), to promote adhesion of the print material or to promote adhesion of a separate adhesive layer on a receiver element substrate. An adhesive layer can be disposed on a substrate in the receiver element and this adhesive layer can have various properties in response to heat (thermally activatable, solvent activatable, or chemically activatable) that aids in the transfer or adhesion of the pattern of print material. Useful adhesive materials of this type are described for example in [0057] of U.S. Patent Application 2008/0233280 (noted above).

In most embodiments, the receiver element comprises a print material receptive layer disposed on a substrate, which print material receptive layer and substrate can be composed of a material such as a suitable polymeric material that is highly receptive of the print material composition. In particular, the print material receptive layer is chosen from the materials described above that are receptive to the printable material composition that forms the desired pattern on the receiver element with high resolution. The print material receptive layer generally has a dry thickness of at least 0.05 µm and up to and including 10 µm, or typically at least 0.05 µm and up to and including 3 µm, when measured at 25° C.

The substrates can be surface-treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.), the disclosures of which are incorporated herein by reference.

Suitable substrates in the receiver elements include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include indium-tin oxide coated glass, indium-tin oxide coated polymeric films, poly(ethylene terephthalate) films, poly(ethylene naphthalate) films, polyimide films, polycarbonate films, polyacrylate films, polystyrene films, polyolefin films, polyamide films, silicon, metal foils, cellulosic papers or resin-coated or glass-coated papers, glass or glass-containing composites, ceramics, metals such as aluminum, tin, and copper, and metalized films. The receiver element substrate can also include one or more charge injection layers, charge transporting layers, and semi-conducting layers on which the functional material pattern is formed.

Particularly useful substrates are polyesters films such as poly(ethylene terephthalate), polycarbonate, or poly(vinylidene chloride) films that have been surface-treated as noted above, or coated with one or more suitable adhesive or subbing layers, the outer layer being receptive to the printable material composition. A useful outer layer can be a vinylidene chloride polymer containing layer.

Useful substrates can have a desired dry thickness depending upon the eventual use of the receiver element, for example its incorporation into various articles or devices (for example optical devices or optical panels). For example, the dry thickness can be at least 0.001 mm and up to and including 10 mm, and especially for polymeric films, the dry thickness can be at least 0.008 mm and up to and including 0.2 mm.

Before contact of the receiver element with the printable material composition, the receiver element is heated to a heating temperature that is higher than the glass transition temperature ($T_{gl}$) of the print material receptive layer to form a heated receiver element. Glass transition temperatures can be determined using Differential Scanning calorimetry. In general, the receiver element is heated to a heating temperature that is at least 10° C. higher than the $T_{gl}$. For example, the receiver element can be heated to a heating temperature that is higher than $T_{gl}$ by at least 10° C. and up to and including 100°

C. before significant distortion or decomposition of the heated receiver element. The time and manner for this heating and manner would be readily determined by a skilled worker, for example using a suitable heating oven or hot surface. In some embodiments such as when the heated receiver element is heat-stabilized poly(ethylene terephthalate),r poly(ethylene naphthalate), or polyamide (such as Kapton), the $T_{gl}$ is at least 20° C. or at least 25° C. lower than the glass transition temperature of the substrate ($T_{gs}$). The receiver element can be provided in already heated form, and either used as provided or heated further.

In general, the receiver element is heated to a temperature that is lower than the glass transition of the receiver element substrate ($T_{gs}$) by at least 5° C. and that is higher than $T_{gl}$ by at least 10° C.

In most embodiments, the $T_{gl}$ is at least 20° C. and typically at least 25° C. lower than $T_{gs}$.

Once the receiver element is heated to the heating temperature for a suitable time, the heated receiver element and print material disposed on the uppermost relief surface of the are contacted such that the elastomeric relief element is compressed for any useful amount, for example by at least 10 μm of its original thickness ("compression distance") or at least 50 μm and up to and including 200 μm of the original thickness. This original thickness is that of only the elastomeric relief element, and does not include any supporting means or surface, such as mounting tape, underneath the elastomeric relief element. The total thickness of the elastomeric relief element can be at least 0.4 mm or even at least 2 mm. The compression distance is generally greater for thicker elastomeric relief elements. The numbers noted above are generally for elastomeric relief elements having a total thickness of 1.14 mm. Because some of the carrier liquid is removed and the printable material flows minimally during this contact procedure in the present invention, a higher impression distance or compression pressure can be used compared to conventional flexography.

In this manner, the print material in the printable material composition (with reduced carrier liquid) disposed on the uppermost relief surface is forced into contact (laminated or embossed with) with the heated receiver element. In general, the heated receiver element and elastomeric relief element can be brought into contact very soon after the receiver element is heated, for example, within 10 milliseconds so that the heated receiver element has minimal time to cool. Alternatively, the heated receiver element can be maintained at the desired heating temperature before and during the contact with the elastomeric relief element using suitable heating and thermal insulation means. When heating is used to remove the carrier liquid from the printable material composition, some of the residual heat is present during transfer of the printable material composition.

The transfer pressure can be applied to either the elastomeric relief element or the heated receiver element to assure contact and complete transfer of the printable material composition to the heated receiver element. For example, transfer of the printable material composition can be carried out by moving the uppermost relief surface of the elastomeric relief element relative to the heated receiver element, by moving the heated receiver element relative to the uppermost relief surface of the elastomeric relief element, or by relative movement of both elements to each other. In some embodiments, the printable material composition is transferred to the heated receiver element manually. In other embodiments, the transfer is automated such as by example, by a conveyor belt, reel-to-reel process, directly driven moving fixtures, chain, belt, or gear-driven fixtures, frictional roller, printing press, or rotary apparatus, or any combination of these methods.

The heated receiver element and elastomeric relief element can be kept in contact for as little as 10 milliseconds or up to 10 seconds or as much as 60 seconds or more. Once the desired contact is completed, the elastomeric relief element is separated from the heated receiver element to leave a desired pattern of the print material on the heated receiver element (which can begin to cool, or it can be maintained at any suitable temperature to provide additional heat treatment such as improving conductivity from curing the printable material). At least 70 weight % of the print material that was originally disposed on the uppermost relief surface of the elastomer relief element (using one or more applications of printable material composition) is transferred to the heated receiver element in a desired pattern. In most embodiments, at least 90 weight % and up to and including 100 weight % of the originally disposed print material composition is transferred to the heated receiver element.

Separation of the elastomeric relief element and the heated receiver element can be accomplished using any suitable means including but not limited to, manual peeling apart, impingement of gas jets or liquid jets, or mechanical peeling devices.

In general, transferring the print material from the raised uppermost relief surface of the elastomeric relief element to the heated receiver element creates a pattern of the print material on the heated receiver element. The transferring can be referred to as "printing" (or lamination or embossing). The pattern of the print material on the heated receiver element can comprise lines, solid areas, dots, or a mixture of lines and solid areas in any desired pattern that text, numbers, shapes, or other images, or combinations thereof. In general, the average line width for printed lines in a pattern on the heated receiver element can be less than 20 μm or even less than 15 μm and as wide as 2 μm. Such lines can also have an average height of at least 10 nm and up to and including 4,000 μm. These average dimensions can be determined by measuring the lines in at least 10 different places and determining the width or height using known image analysis tools including but not limited to, profilometry, optical microscopic techniques, atomic force microscopy, and scanning electron microscopy.

While a particularly useful method of applying the print material to the heated receiver element include the use of flexography and the elastomeric relief element is a flexographic printing member comprising a relief image, the print material composition can also be applied to a heated receiver element using alternative appropriate printing methods that would be readily apparent to one skilled in the art using the teaching provided herein.

The method of this invention can be carried out at room temperature such as at least 17° C. to and including 30° C. but is not so limited, and can be carried out at a lower temperature down to about 5° C., or at an elevated temperature up to 200° C. provided that the heat does not harm the elastomeric relief element, the print material, the heated receiver element, or their ability to form a pattern on the heated receiver element.

In some of the embodiments, the method of this invention provides a printed pattern of fine lines of a print material containing a seed material for a subsequent electroless plating process. For example, for copper electroless plating, such seed materials include but are not limited to, metals such as palladium, tin, and silver, or a mixture of tin and palladium.

For example, the method of this invention can be used to provide a pattern of a print material that is protective of an underlying uniform metal film during a subsequent etching process.

In other embodiments, the method of this invention can be used to provide a pattern of fine lines of a print material having an electrical conductivity that is high enough for a subsequent electroplating process. Such an electrical conductivity is at least 0.1 S/cm and the details of such processes are known in the art.

After the pattern of print material has been applied to the heated receiver element in a suitable manner, the pattern can be further treated if desired using heat or exposure to actinic radiation (such as UV, visible, or IR radiation). For example, if the print material contains metal nanoparticles, the pattern of print material can be heated to sinter the particles and render the pattern lines or shapes conductive. Sintering provides a coherent bonded mass from heating a metal powder in the form of metal nanoparticles, without melting. Sintering can be carried out using temperatures and conditions that would be apparent to one skilled in the art. The pattern of print material can alternatively be chemically treated to change its properties, such as conductivity, color, or reflectivity using conditions, materials, and procedures that would be readily apparent to one skilled in the art.

The present invention provides at least the following embodiments and combinations thereof, but other combinations of features are considered to be within the present invention as a skilled artisan would appreciate from the teaching of this disclosure:

1. A method for forming a pattern of a print material on a receiver element comprising a print material receptive layer, the method comprising:

providing an elastomeric relief element that comprises a relief pattern comprising (1) an uppermost relief surface, and (2) an average relief image depth of at least 50 μm relative to the uppermost relief surface and a shoulder angle greater than 25° and up to and including 85° from vertical, and (3) a modulus of elasticity of at least 2 megaPascals and up to and including 10 megaPascals, applying a printable material composition to the uppermost relief surface of the elastomeric relief element, the printable material composition comprising a print material and a carrier liquid, the printable material composition having a viscosity of at least 1 cps and up to and including 1500 cps, removing at least 50 weight % of the carrier liquid from the printable material composition that is disposed on the uppermost relief surface of the elastomeric relief element, leaving print material disposed on the uppermost relief surface, providing a receiver element comprising a print material receptive layer disposed on a substrate, wherein the print material receptive layer has a dry thickness of at least 0.05 μm and up to and including 10 μm when measured at 25° C., heating the receiver element to a heating temperature that is higher than the glass transition temperature ($T_{gl}$) of the print material receptive layer, to form a heated receiver element, contacting the print material disposed on the uppermost relief surface and the heated receiver element such that the elastomeric relief element is compressed and the print material disposed on the uppermost relief surface is in contact with the heated receiver element, and separating the elastomeric relief element from the heated receiver element to leave a pattern of the print material on the heated receiver element, wherein at least 70 weight % of the print material originally disposed on the uppermost relief surface of the elastomeric relief element is transferred to the heated receiver element.

2. The method of embodiment 1 comprising removing at least 75 weight % of the carrier liquid from the printable material composition on the uppermost relief surface of the elastomeric relief element.

3. The method of embodiment 1 or 2 comprising removing at least 80 weight % of the carrier liquid from the printable material composition on the uppermost relief surface of the elastomeric relief element.

4. The method of any of embodiments 1 to 3 comprising transferring at least 90 weight % of the print material originally disposed on the uppermost relief surface of the elastomeric relief element to the heated receiver element.

5. The method of any of embodiments 1 to 4 comprising heating the receiver element to a temperature that is lower than $T_{gs}$ by at least 5° C. and that is higher than $T_{gl}$ by at least 10° C.

6. The method of any of embodiments 1 to 5, wherein the printable material composition has a viscosity of at least 200 cps and up to and including 900 cps.

7. The method of any of embodiments 1 to 6, wherein the print material receptive layer has a dry thickness of at least 0.05 μm and up to and including 3 μm when measured at 25° C.

8. The method of any of embodiments 1 to 7, wherein the elastomeric relief element is a flexographic printing member and the relief pattern has an average relief image depth of at least 100 μm relative to the uppermost relief surface.

9. The method of embodiment 8, wherein the flexographic printing member has a modulus of elasticity of at least 4 megaPascals and up to and including 8 megaPascals.

10. The method of any of embodiments 1 to 9, comprising providing the elastomeric relief element by imagewise exposing an elastomeric relief element precursor.

11. The method of any of embodiments 1 to 10, comprising providing the elastomeric relief element by imagewise exposing an elastomeric relief element through a mask image.

12. The method of any of embodiments 1 to 11, wherein the printable material composition comprises a print material that comprises nanoparticles of an electrically conductive material selected from the group consisting of silver or silver precursor, gold, copper, palladium, indium-tin oxide, or combinations thereof.

13. The method of any of embodiments 1 to 12, wherein the printable material is a colorant.

14. The method of any of embodiments 1 to 13, wherein the print material is selected from the group consisting of electrically conductive materials, semi-conductive materials, dielectric materials, small molecule materials, polymeric materials, bio-based materials, electro luminescence materials, and combinations thereof.

15. The method of any of embodiments 1 to 14, wherein the elastomeric relief element comprises a relief layer comprising the relief pattern, which relief layer is disposed on a substrate.

16. The method of any of embodiments 1 to 15 for providing a pattern of the print material on the heated receiver element comprising lines having an average line width of less than 15 μm.

17. The method of any of embodiments 1 to 16 for providing a pattern of a print material that comprises a seed material for a subsequent electroless plating process.

18. The method of any of embodiments 1 to 16 for providing a pattern of a print material that is protective of an underlying uniform metal film during a subsequent etching process.

19. The method of any of embodiments 1 to 18, wherein the pattern of a print material is printed onto a primer layer, adhesive layer, charge injection layer, charge transporting layer, or semiconducting layer on the heated receiver element.

20. The method of any of embodiments 1 to 19, wherein the elastomeric relief element is compressed by at least 10 μm of its original thickness.

21. The method of any of embodiments 1 to 20, where the method further comprises:

repeating the applying and removing steps together, in the noted sequence, at least once using additional amounts of the same printable material composition and the same elastomeric relief element, to provide an increased amount of print material disposed on the uppermost relief surface.

22. The method of embodiment 21, wherein the relief pattern in the elastomeric relief element has an average relief image depth of at least 100 μm relative to the uppermost relief surface, and a shoulder angle of at least 50° to but less than 75° from vertical.

23. The method of embodiment 21 or 22, wherein the pattern of print material on the heated receiver element has an average density of at least 3.5.

24. The method of any of embodiments 21 to 23, comprising the following conditions:

removing at least 75 weight % of the carrier liquid from the printable material composition on the uppermost relief surface of the elastomeric relief element, transferring at least 90 weight % of the print material originally disposed on the uppermost relief surface of the elastomeric relief element to the heated receiver element, and contacting the print material disposed on the uppermost relief surface and the heated receiver element, wherein the print material receptive layer has a dry thickness of at least 0.05 μm and up to and including 3 μm when measured at 20° C., wherein the flexographic printing member has a modulus of elasticity of at least 4 megaPascals and up to and including 8 megaPascals, and wherein the printable material composition comprises a print material that comprises nanoparticles of an electrically conductive material selected from the group consisting of silver, gold, copper, palladium, indium-tin oxide, or combinations thereof.

25. The method of any of embodiments 21 to 24, wherein the printable material composition comprises a print material that comprises nanoparticles of a silver salt.

26. The method of any of embodiments 21 to 25, wherein the printable material composition comprises a print material that comprises nanoparticles of silver metal, and the elastomeric relief element is a flexographic printing member.

The following Examples are provided to illustrate the practice of this invention and are not meant to be limiting in any manner.

These examples are carried out to provide printed conductive silver patterns on a flexible polymeric substrate (coated or non-coated) using flexographic printing plate precursors prepared as described in U.S. Pat. No. 8,142,987 (noted above) that was imaged to provide a relief pattern in a flexographic printing plate as an elastomeric relief element, using a high resolution imaging device.

Each sample of Flexcel™ NX flexographic printing plate precursor having a 1.14 total dry thickness, was provided as an elastomeric relief element and imaged to provide a relief pattern having an uppermost relief surface and an average relief image depth of 250 μm containing grid features spaced 400 μm apart and a line width of 6 μm. Each elastomeric relief element was then mounted using 3M brand 1120 adhesive-backed tape onto the plate cylinder of a Flexiproofer™ 100 flexographic printer (obtained from RK PrintCoat Instruments, Ltd., United Kingdom). The total outer diameter of the plate cylinder assembly was 128.5 mm.

A specific ink (printable material composition), as described below and comprising a print material and a carrier liquid, was applied to the substantially only to the uppermost relief surface of each elastomeric relief element using a 1.6 BCM, 1600 lpi Anilox roller at a speed of 50 meters/minute and impression distance of 50 μm. Each ink had a viscosity of at least 100 cps at room temperature, and was applied twice to each elastomeric relief element with an 8 second wait between each ink application to allow room temperature drying of the ink (removing at least 75 weight % of the carrier liquid) after each application.

After the second application of ink, the plate cylinder with the each attached inked elastomeric relief element was removed and impressed against a provided receiver element that had been heated. Each receiver element was a polymer-coated substrate composed of poly(ethylene terephthalate) (PET). The various polymer coatings are described below. Each receiver element was heated by pressing it against a heated silicone rubber-coated print cylinder having a surface hardness of 50 Shore A and a surface temperature of 125° C. The total outer diameter of this heated silicone rubber-coated print cylinder assembly was 137.8 mm. The plate cylinder assembly was impressed a distance of 0.4 mm into the print cylinder assembly to produce a nip width of 9.5 mm and a 105 μm compression of the elastomeric relief element.

While the plate cylinder assembly and the print cylinder assembly were in compression contact, they were rotated at a linear surface speed of 30 min/sec. The ink (print material) from each relief pattern on the elastomeric relief element plate surface was transferred under these conditions to the heated surface of the respective receiver element, and the elastomeric relief element was compressed by a certain amount, that is at least certain μm of its original thickness when measured at 25° C. The amounts of compression for some of the experiments are described below. After separation of the elastomeric relief element and the receiver element, the printed pattern of ink on the receiver element was then oven cured at 105° C. for 5 minutes. This curing is not essential to the invention but it can provide additional benefits of improved conductivity and adhesion to the receiver element surface. For embodiments of this invention, at least 80 weight % of the print material originally disposed on the uppermost relief surface of the elastomeric relief element was transferred to the heated receiver element.

PChem Ink PFI-722, obtained from PChem Associates (Bensalem, Pa.), was used as a conductive silver-containing functional material composition (ink) in many of the Examples described below in TABLES I-IV. The water-based Black ink was Performa SP4C Process Black XGL044113 (Water Ink Technologies, Inc.), was used as a carbon black-containing functional material composition (ink) in some of the Examples described below in TABLE IV.

Coatings applied to films of poly(ethylene terephthalate) (PET) were prepared as receiver elements as shown below in TABLES I-IV. Unless noted otherwise, each coating was applied in at a coverage of 50 mg/ft$^2$ (540 mg/m$^2$) on the PET [one coating coverage was 30 mg/ft$^2$ (324 mg/m$^2$)]. The various coatings are identified as follows:

"Hd" refers to a vinylidene chloride polymer latex coating, for example that is commonly used in preparing photographic silver halide films, the composition of which would be known in the art.

Butvar® B76 is a commercial poly(vinyl butyral) that can be obtained from various commercial sources including Solutia, Inc. (Indian Orchard, Mass.), now a subsidiary of Eastman Chemical Company (Kingsport, Tenn.).

PVDC refers to a vinylidene chloride polymer applied from an organic solvent.

Elvacite® E2014 and E2044 are commercial acrylate polymers that are available from Lucite International.

Carboset® 525 and 527 are commercial acrylate polymers that are available from Lubrizol Corporation.

In the Examples described in TABLE I, various features of receiver elements and formation of printed patterns ("Receiver Element Effects") were evaluated.

Transfer Speed (m/min) refers to linear surface speed through the nip of impression rollers used for lamination.

Impression Effect (mm) refers to the impression distance between rollers past just touching impression.

Solid resistivity (ohm/sq) refers to surface resistivity of solid area deposits of ink 8 mm in diameter, as measured using Surface Resistivity Meter SRM-232 (Guardian Manufacturing Inc.).

Grid resistivity (ohm/sq) refers to surface resistivity of grid patterns of conductive ink and was measured by an ohm meter across a length 104 mm long and 4 mm wide (26 squares).

Line width (μm) was measured by optical microscopy and was the average of seven measurements.

% Ink Transferred (INKtran) refers to the amount of ink that was transferred from the elastomeric relief element to a specific heated receiver element, and was determined by measuring the transmission optical absorbance or density (TOD) (using an ortho filter of an X-Rite 360 Transmission densitometer) of the printable material on the receiver element and the residual printable material composition (INKres) on the elastomeric relief element after contact transfer. The % ink transferred (% INKtran) is calculated as:

INKtran=TOD INKtran/(TOD INKtran+TOD INKres)

Unless otherwise indicated, all of the Examples were carried out using an apparatus or system that is schematically described as roll-to-roll equipment, as depicted in FIG. 1, which is not intended to be limiting as to the apparatus means that can be used to practice the present invention.

As illustrated in FIG. 1, an elastomeric relief element (10) was provided on a suitable plate roller (20). A printable material composition ("ink") was applied to the uppermost relief surface of elastomeric relief element (10) using the Anilox inking system (30) as a suitable application means. The printable material composition comprised a print material and carrier liquid, and for the embodiments of this invention, a certain portion of the carrier liquid was removed from the printable material composition using dryer (40) that was arranged close to elastomeric relief element (10). Receiver element (50) was brought into the apparatus on a suitable path (60) and heated on heated roller (70) at a suitable temperature and time, and then brought into contact with the print material disposed on the uppermost relief surface of elastomeric relief element (10). The elastomeric relief element (10) was then separated from the heated receiver element (50) after transferring the print material to the heated relief element (50). The arrows in FIG. 1 show the direction of the path (60) as well as the direction of rotation of various components of the apparatus.

The run conditions and results for the Invention and Comparative Examples are presented below in various TABLES.

Comparative Examples 1 and 2 provided poor quality of ink transfer to these receiver materials. These results indicate that no or very little ink bad been transferred to the heated receiver element and were categorized as "poor". This "poor" state was shown in an optical micrograph to indicate broken or non-continuous printed lines, which broken lines exhibited very poor (or megaohm) levels of conductivity.

Invention Examples 1 and 3 showed good levels of conductivity and sharp line definition as shown in an optical micrograph. A high percentage of ink was transferred as shown by the low value of solid area resistivity. Invention Example 3 showed some loss in ink transfer and some broken lines compared to Invention Example 2 due to the thinner layer of receiver layer on the receiver element.

Invention Examples 5 and 9 showed some loss in line transfer to the receiver element, resulting in broken lines when higher transfer speed was used.

TABLE I

| Example | Receiver Element Effects Receiver Element | Transfer Speed (m/min) | Impression Effect (mm) | Solid Resistivity (ohm/sq) | Grid Resistivity (ohm/sq) | Comments about lines | Line Width (μm) | % Ink Transferred |
|---|---|---|---|---|---|---|---|---|
| Invention Example 1 | Hd | 1.2 | 0.4 | 0.21 | 6.5 | Sharp lines | 6 | 85 |
| Invention Example 2 | Butvar ® B76 | 1.2 | 0.4 | 0.23 | 7.7 | Sharp lines | 6 | 82 |
| Comparative Example 1 | PVDC Primed PET | 1.2 | 0.4 | 158 | Megaohms | Broken | Poor | 15 |
| Comparative Example 2 | Bare PET | 1.2 | 0.4 | 479 | Megaohms | Broken | Poor | 18 |
| Invention Example 3 | Butvar ® B76 (30 mg/ft²) | 1.2 | 0.4 | 0.24 | 170 | Some broken lines | 6 | 80 |

| Example | Receiver Element | Speed and Temperature Effects Transfer Speed (m/min) | Impression (mm) | Solid Resistivity (Ohm/sq) | Grid Resistivity (Ohm/sq) | Comments on lines | Line width (μm) | % Ink Transferred |
|---|---|---|---|---|---|---|---|---|
| Invention Example 4 | Elvacite ® 2014 | 1.2 | 0.4 | 0.23 | 9.5 | Sharp lines | 5.5 | 82 |
| Invention Example 5 | Elvacite ® 2014 | 2.4 | 0.4 | 0.23 | 245 | Broken lines | 5.5 | 85 |
| Invention Example 6 | Elvacite ® 2044 | 1.2 | 0.4 | 0.22 | 12 | Sharp lines | 6 | 90 |
| Invention Example 7 | Elvacite ® 2044 | 3.0 | 0.4 | 0.22 | 7.2 | Sharp lines | 5.5 | 78 |
| Invention | Carboset ® | 1.5 | 0.4 | 0.27 | 9.2 | Sharp lines | 6 | 87 |

TABLE I-continued

| | | Transfer Speed (m/min) | Impression Effect Impression (mm) | Solid Resistivity (Ohm/sq) | Grid Resistivity (Ohm/sq) | Comments on lines | Line Width (μm) | % Ink Transferred |
|---|---|---|---|---|---|---|---|---|
| Example 8 | 525 | | | | | | | |
| Invention Example 9 | Carboset ® 525 | 3.6 | 0.4 | 0.22 | 350 | Broken lines | 5.5 | 72 |
| Invention Example 10 | Butvar ® B76 | 1.2 | 0.4 | 0.23 | 7.7 | Sharp lines | 6 | 82 |
| Invention Example 11 | Butvar ® B76 | 2.7 | 0.4 | 0.23 | 7.7 | Sharp lines | 5 | 82 |

Invention Examples 12-15 showed the effect of impression distance on transfer quality. Lower impression distances (Invention Examples 12 and 13, or those commonly used in wet flexographic presses) showed non-optimized ink transfer with breaks in the lines or whole line sections missing. Excessive impression distances as shown by Invention Example 15 showed the elastomeric relief element was over compressed with resulting bending of the elastomeric relief element features and wavy lines that show increased line width.

element is inadequate for desired transfer of printable material if the receiver sheet was not heated to provide desired affinity for the transferred printable material.

Comparative Examples 6, 13, and 14 also exhibited poor transfer of printable material, as indicated by the resulting data showing variability in line width and poor conductivity. These data show that the carrier liquid adversely affected line quality even though the receiver sheet was heated.

| | Receiver Element | Transfer Speed (m/min) | Impression Effect Impression (mm) | Solid Resistivity (Ohm/sq) | Grid Resistivity (Ohm/sq) | Comments on lines | Line Width (μm) | % Ink Transferred |
|---|---|---|---|---|---|---|---|---|
| Invention Example 12 | Elvacite ® 2044 | 3.0 | 0.2 | 0.25 | 32 | Slight breaks | 6 | 82 |
| Invention Example 13 | Elvacite ® 2044 | 3.0 | 0.1 | 0.23 | 125 | Line sections missing | 5.5 | 74 |
| Invention Example 14 | Elvacite ® 2044 | 3.0 | 0.8 | 0.19 | 12 | Wavy lines | 7 | 88 |
| Invention Example 15 | Elvacite ® 2044 | 3.0 | 0.4 | 0.22 | 7.2 | Sharp continuous lines | 6 | 78 |

The results shown in TABLE I provide considerable information about the present invention. Invention Examples 1, 2, 4, 6, 7, 8, 10, 11, and 15 represent optimized heated receiver elements, transfer speed, and impression pressure effect. Invention Examples 3, 5, 9, 12, 13, and 14 did not provide optimized conductivity or resulting conductive lines in a printed pattern. However, with the particular equipment and elastomeric relief elements used in the noted experiments, the method of this invention was suitably demonstrated. The results could readily be optimized by a skilled worker using routine experimentation in view of the disclosure provided herein to modify impression pressure during ink transfer, ink transfer speed variables including time and temperature, and imaging and transfer equipment.

The Examples described in the following TABLE II are directed to an evaluation of the effects of the room temperature drying time of the PChem PFI-722 ink (functional material composition) on the elastomeric relief element between the two inkings (applications of ink), followed by ink transfer at a speed of 10 ft/min (3.0 m/min) and 0.4 mm impression pressure.

Comparative Examples 3 and 10 show that wider and variable line widths were obtained when no drying time is used to remove carrier liquid on the elastomeric relief element. This feature can also be referred to as "wet transfer" and is typically used in elastomeric transfer. Comparative Example 7 shows that similar poor transfer occurred when a piece of adhesive tape was used as the receiver layer.

Comparative Examples 4, 5, 8, 9, 10, 11, and 12 carried out using an unheated receiver element (kept at room temperature) showed poor printable material transfer as indicated by variability in line width and poor conductivity. These results show that removing the carrier liquid on the elastomeric relief Invention Example 16 exhibited good line quality as evidenced by sharp lines and good conductivity when the carrier liquid was sufficiently removed from the elastomeric relief element and the receiver element was properly heated to provide affinity for the printable material to affect good transfer.

TABLE II

| Example | Receiver Element | Ink Transfer Temperature (° C.) | Drying Time (seconds) | Comments on Lines | % Ink Transferred |
|---|---|---|---|---|---|
| Comparative Example 3 | PVDC Coated PET | 25 | 0 | Variable lines; some conductivity | 55 |
| Comparative Example 4 | PVDC Coated PET | 25 | 1 | Thinner variable lines; poor conductivity | 30 |
| Comparative Example 5 | PVDC Coated PET | 25 | 5 | Very poor ink transfer | 2 |
| Comparative Example 6 | PVDC Coated PET | 125 | 0 | Distorted lines; incomplete solid ink transfer | Not measured |
| Comparative Example 7 | Adhesive tape | 25 | 0 | Variable, wide lines; some conductivity | 55 |
| Comparative Example 8 | Adhesive tape | 25 | 2 | Thin, variable lines; poor conductivity | 70 |
| Comparative Example 9 | Adhesive tape | 25 | 5 | Thin, distorted lines; poor conductivity | Not measured |

TABLE II-continued

| Example | Receiver Element | Ink Transfer Temperature (° C.) | Drying Time (seconds) | Comments on Lines | % Ink Transferred |
|---|---|---|---|---|---|
| Comparative Example 10 | Elvacite ® 2044 | 25 | 0 | Variable, wide lines; some conductivity | 55 |
| Comparative Example 11 | Elvacite ® 2044 | 25 | 1 | Thin, variable lines, poor conductivity | 30 |
| Comparative Example 12 | Elvacite ® 2044 | 25 | 5 | Very poor ink transfer | 2 |
| Comparative Example 13 | Elvacite ® 2044 | 125 | 0 | Distorted lines; incomplete ink transfer | 50 |
| Comparative Example 14 | Elvacite ® 2044 | 125 | 1 | Broken lines, incomplete ink transfer | 60 |

The results shown in TABLE II indicate that transfer temperature and drying time between ink applications should be optimized with a specific type of elastomeric relief element, heated receiver element, and ink transfer equipment. With the particular set of method features and equipment demonstrated with these experiments, only Invention Example 16 used the optimal method features to provide desired printed pattern characteristics and high % ink transferred.

The Invention Examples 17-26 described in the following TABLE III are directed to an evaluation of the relief image and shoulder angle effects using various conditions of back exposure of the elastomeric relief element during relief image formation. PChem PFI-722 ink (functional material composition) was applied to the elastomeric relief element using two inkings (applications of ink to the elastomeric relief image) with eight seconds between inkings for room temperature drying, followed by ink transfer at a speed of 10 ft/min (3.0 m/min) and 0.4 mm impression pressure. Shoulder angle was changed by adjusting the exposure technique. A low shoulder angle was obtained by not using a low refractive index layer in the elastomeric relief element (flexographic printing precursor), and a high shoulder angle was obtained by using a collimated UV light source during formation of the relief image. Shoulder angle was measured as described in U.S. Pat. No. 7,799,504 (noted above).

Back side exposure refers to overall blanket UV exposure from a bank of UV fluorescent bulbs through the back of the elastomeric relief element precursor to create a floor of photopolymer layer. Front side exposure refers to UV exposure conditions using a bank of UV fluorescent bulbs through the mask to create retained surface relief image features.

Invention Examples 18 and 22 with low relief or shallower (less than 50° shoulder angles, exhibited that printable material deposited on the sides of the elastomeric relief element features during inking can be transferred to the receiver element to produce deposits on the sides of the lines as shown in an optical image.

Invention Examples 19, 20, and 23 with either high relief or sharper shoulder angles (more than 65°), exhibited that elastomeric relief element features were not well supported and became distorted under impression during transfer to the heated receiver element, resulting in lines that are wavy and vary in width as shown in an optical image.

Invention Examples 17 and 21 show elastomeric relief element features that have shoulder angles and relief image depth that provided supported line features and produced good line features when impressed against the receiver element.

TABLE III

Relief and Shoulder Angle Effects

| Example | Receiver Element | Back side Exposure (seconds) | Relief Image Depth (mm) | Shoulder Angle (°) | Comments on Lines |
|---|---|---|---|---|---|
| Invention Example 17 | Elvacite ® 2044 | 22 | 0.3 | 57 | Sharp lines |
| Invention Example 18 | Elvacite ® 2044 | 30 | 0.2 | 57 | Some deposits on lines and edges |
| Invention Example 19 | Elvacite ® 2044 | 12 | 0.5 | 57 | Some wavy lines |
| Invention Example 20 | Elvacite ® 2044 | 5 | 0.65 | Not measured | Distorted, wavy lines |
| Invention Example 21 | Elvacite ® 2044 | 22 | 0.3 | 57 | Sharp lines |
| Invention Example 22 | Elvacite ® 2044 | 22 | 0.35 | 40 | Partial side effects |
| Invention Example 23 | Elvacite ® 2044 | 22 | 0.4 | 85 | Broken, bent, wavy lines |

The results demonstrated in the data for Invention Example 17-23 illustrate that the best relief image, shoulder angle, and line features can be obtained using an optimized set of imaging conditions including the use of certain back side exposure of the elastomeric relief element. Invention Examples 25 and 26 exhibit elastomeric relief element features that have less hardness (as measured with a shore A Durometer hardness gauge) that produced bent, distorted, and wider transferred lines due to barreling or spreading distortion of the elastomeric relief element under transfer impression. Invention Example 24 exhibited good line quality when the elastomeric relief element was of sufficient hardness to maintain line structure under the impression conditions. Though not limiting the scope of this invention, it is considered that increasing UV exposure of the elastomeric relief element features increase crosslinking density and produces a harder, less compressible elastomeric relief element.

Relief Element Hardness Effects

| Example | Receiver Element | Front side Exposure (minutes) | Relief Depth (mm) | Durometer Hardness | Comments on Lines |
|---|---|---|---|---|---|
| Invention Example 24 | Elvacite ® 2044 | 12 | 0.3 | 76 | Sharp lines |
| Invention Example 25 | Elvacite ® 2044 | 6 | 0.3 | 73 | Slightly bent lines |
| Invention Example 26 | Elvacite ® 2044 | 2 | 0.3 | 66 | Spread out, distorted lines |

The results shown in TABLE III for Invention Examples 24-26 indicate that as the hardness of the relief image in the elastomeric relief element is increased, the resulting printed pattern lines on the heated receiver element are more defined. The hardness can be increased, for example, by higher front side exposure time. This parameter can also be adjusted using routine experimentation for a given elastomeric relief element, heated receiver element, front side exposure conditions, and ink transfer conditions. The shore A Durometer Hardness was measured by using known equipment.

The Examples shown in the following TABLE IV are directed to the evaluation of two different inks (functional material compositions) and the effects from a single inking or multiple inkings (applications of ink to the elastomeric relief element) in which there were about eight seconds between inkings for room temperature drying.

Invention Examples 27, 28, and 29 exhibit the results of 2, 1, and 4 sequential inkings, respectively, and removing carrier liquid from the elastomeric relief element before transfer to the heated receiver element. Decrease in solid resistivity with increase in number of inkings shows the accumulation of printable material on the elastomeric plate is accomplished. The very slight increase in line width with increased inkings shows the printable material does not significantly spread. The decrease in grid resistivity shows the deposited printable material in the first inking is not adversely affected by subsequent inkings, but rather accumulates to provide improved conductivity.

Invention Examples 30, 31 and 32 exhibit the results of 1, 2, and 4 sequential inkings, respectively, and removing the carrier liquid from the elastomeric relief element before transfer. The proportional increase in transmission optical density (TOD, where TOD is directly proportional to the amount of material) on the printed pattern shows the ability to accumulate additional printable material on the elastomeric relief element before transfer to the heated receiver element. The good line definition and sharp lines and minimal change in measured line width indicate the printable material did not significantly spread even though the thickness of the printable material was increased on the elastomeric relief element after several inkings.

The invention has been described in detail with particular reference to certain preferred embodiments thereof; but it will be understood that variations and modifications can be effected within the spirit and scope of the invention.

The invention claimed is:

1. A method for forming a pattern of a print material on a receiver element comprising a print material receptive layer, the method comprising:

providing an elastomeric relief element that comprises a relief pattern comprising (1) an uppermost relief surface, and (2) an average relief image depth of at least 50 μm relative to the uppermost relief surface and a shoulder angle greater than 25° and up to and including 85° from vertical, and (3) a modulus of elasticity of at least 2 megaPascals and up to and including 10 megaPascals, applying a printable material composition to the uppermost relief surface of the elastomeric relief element, the printable material composition comprising a print material and a carrier liquid, the printable material composition having a viscosity of at least 1 cps and up to and including 1500 cps, removing at least 50 weight % of the carrier liquid from the printable material composition that is disposed on the uppermost relief surface of the elastomeric relief element, leaving print material disposed on the uppermost relief surface, providing a receiver element comprising a print material receptive layer disposed on a substrate, wherein the print

TABLE IV

| Example | Ink | Receiver Element | # of Inkings | Solid Resistivity (Ohm/sq) | Grid Resistivity (Ohm/sq) | Comments on Lines | Line Width (μm) | Line Quality | % Ink Transferred |
|---|---|---|---|---|---|---|---|---|---|
| Invention Example 27 | PChem PFI-722 | Hd Coated PET | 2 | 0.21 | 6.5 | Sharp lines | 6 | Excellent | 85 |
| Invention Example 28 | PChem PFI-722 | Hd Coated PET | 1 | 0.47 | 14 | Sharp lines | 5.5 | Excellent | 80 |
| Invention Example 29 | PChem PFI-722 | Hd Coated PET | 4 | 0.11 | 3.8 | Sharp lines | 6.5 | Excellent | 75 |
| Invention Example 30 | Black ink | Elvacite ® 2044 | 1 | 1.6 | Not measured | | Not measured | Good line definition | 90 |
| Invention Example 31 | Black ink | Elvacite ® 2044 | 2 | 3 | Not measured | | Not measured | Good line definition | 92 |
| Invention Example 32 | Black ink | Elvacite ® 2044 | 4 | 4.2 | Not measured | | Not measured | Good line definition | 87 |

Invention Example 33 and Comparative Example 15

In Invention Example 33, a PVDC printed (Carboset 525 coated) PET receiver element was used, the transfer speed was 3.6 m/min, the heated roller temperature was 125° C., and the impression was 0.4 mm. The apparatus shown in FIG. 1 was used. With at least 70% of the print material being transferred from the elastomeric relief element, the printed thin lines on the receiver element after transfer had a solid resistivity of 0.27 ohms/square, grid resistivity of 9.2 ohms/square, and a consistent measured width of about 6 μm.

In contrast, Comparative Example 15 was carried out in the same manner except that none of the carrier liquid was removed from the printable material composition (the dryer of FIG. 1 was not used) and only one inking of the elastomeric relief element was carried out. After transfer (or printing) of only 45% of the print material from the elastomeric relief element to an unheated receiver element, the printed lines on the receiver element had a solid resistivity of 9.5 ohms/square and a grid resistivity of 750 ohms/square, but they exhibited variable and measured width of about 16 μm.

material receptive layer has a dry thickness of at least 0.05 μm and up to and including 10 μm when measured at 25° C., heating the receiver element to a heating temperature that is higher than the glass transition temperature ($T_{gl}$) of the print material receptive layer, to form a heated receiver element, contacting the print material disposed on the uppermost relief surface and the heated receiver element such that the elastomeric relief element is compressed and the print material disposed on the uppermost relief surface is in contact with the heated receiver element, and separating the elastomeric relief element from the heated receiver element to leave a pattern of the print material on the heated receiver element, wherein at least 70 weight % of the print material originally disposed on the uppermost relief surface of the elastomeric relief element is transferred to the heated receiver element.

2. The method of claim 1 comprising removing at least 75 weight % of the carrier liquid from the printable material composition on the uppermost relief surface of the elastomeric relief element.

3. The method of claim 1 comprising removing at least 80 weight % of the carrier liquid from the printable material composition on the uppermost relief surface of the elastomeric relief element.

4. The method of claim 1 comprising transferring at least 90 weight % of the print material originally disposed on the uppermost relief surface of the elastomeric relief element to the heated receiver element.

5. The method of claim 1 comprising heating the receiver element to a temperature that is lower than $T_{gs}$ by at least 5° C. and that is higher than $T_{gl}$ by at least 10° C.

6. The method of claim 1, wherein the printable material composition has a viscosity of at least 200 cps and up to and including 900 cps.

7. The method of claim 1, wherein the print material receptive layer has a dry thickness of at least 0.05 μm and up to and including 3 μm when measured at 25° C.

8. The method of claim 1, wherein the elastomeric relief element is a flexographic printing member and the relief pattern has an average relief image depth of at least 100 μm relative to the uppermost relief surface.

9. The method of claim 8, wherein the flexographic printing member has a modulus of elasticity of at least 4 megaPascals and up to and including 8 megaPascals.

10. The method of claim 1, comprising providing the elastomeric relief element by imagewise exposing an elastomeric relief element precursor.

11. The method of claim 1, comprising providing the elastomeric relief element by imagewise exposing an elastomeric relief element through a mask image.

12. The method of claim 1, wherein the printable material composition comprises a print material that comprises nanoparticles of an electrically conductive material selected from the group consisting of silver, gold, copper, palladium, indium-tin oxide, or combinations thereof.

13. The method of claim 1, wherein the printable material is a colorant.

14. The method of claim 1, wherein the print material is selected from the group consisting of electrically conductive materials, semi-conductive materials, dielectric materials, small molecule materials, polymeric materials, bio-based materials, electro luminescence materials, and combinations thereof.

15. The method of claim 1, wherein the elastomeric relief element comprises a relief layer comprising the relief pattern, which relief layer is disposed on a substrate.

16. The method of claim 1 for providing a pattern of the print material on the heated receiver element comprising lines having an average line width of less than 15 μm.

17. The method of claim 1 for providing a pattern of a print material that comprises a seed material for a subsequent electroless plating process.

18. The method of claim 1 for providing a pattern of a print material that is protective of an underlying uniform metal film during a subsequent etching process.

19. The method of claim 1, wherein the pattern of a print material is printed onto a primer layer, adhesive layer, charge injection layer, charge transporting layer, or semiconducting layer on the heated receiver element.

20. A method for forming a pattern of a print material on a receiver element comprising a print material receptive layer, the method comprising:

providing an elastomeric relief element that comprises a relief pattern comprising (1) an uppermost relief surface, and (2) an average relief image depth of at least 50 μm relative to the uppermost relief surface and a shoulder angle greater than 25° and up to and including 85° from vertical, and (3) a modulus of elasticity of at least 2 megaPascals and up to and including 10 megaPascals, applying a printable material composition to the uppermost relief surface of the elastomeric relief element, the printable material composition comprising a print material and a carrier liquid, the printable material composition having a viscosity of at least 1 cps and up to and including 1500 cps, removing at least 25 weight % of the carrier liquid from the printable material composition that is disposed on the uppermost relief surface of the elastomeric relief element, leaving print material disposed on the uppermost relief surface, repeating the preceding applying and removing steps together, in the noted sequence, at least once using additional amounts of the same printable material composition and the same elastomeric relief element, to provide an increased amount of print material disposed on the uppermost relief surface, providing a receiver element comprising a print material receptive layer disposed on a substrate, wherein the print material receptive layer has a dry thickness of at least 0.05 μm and up to and including 10 μm when measured at 25° C., heating the receiver element to a heating temperature that is higher than the glass transition temperature ($T_{gl}$) of the print material receptive layer, to form a heated receiver element, contacting the print material disposed on the uppermost relief surface and the heated receiver element such that the elastomeric relief element is compressed by at least 10 μm of its original thickness, and the increased amount of print material disposed on the uppermost relief surface is in contact with the heated receiver element, and separating the elastomeric relief element from the heated receiver element to leave a pattern of the print material on the heated receiver element, wherein at least 70 weight % of the print material originally disposed on the uppermost relief surface of the elastomeric relief element is transferred to the heated receiver element.

21. The method of claim 20, wherein the relief pattern in the elastomeric relief element has an average relief image depth of at least 100 μm relative to the uppermost relief surface, and a shoulder angle of at least 50° to but less than 75° from vertical.

22. The method of claim 20, wherein the pattern of print material on the heated receiver element has an average density of at least 3.5.

23. The method of claim 20, comprising the following conditions:

removing at least 75 weight % of the carrier liquid from the printable material composition on the uppermost relief surface of the elastomeric relief element, transferring at least 90 weight % of the print material originally disposed on the uppermost relief surface of the elastomeric relief element to the heated receiver element, and contacting the print material disposed on the uppermost relief surface and the heated receiver element, wherein the print material receptive layer has a dry thickness of at least 0.05 μm and up to and including 3 μm when measured at 20° C., wherein the flexographic printing member has a modulus of elasticity of at least 4 megaPascals and up to and including 8 megaPascals, and wherein the printable material composition comprises a print material that comprises nanoparticles of an electrically conductive material selected from the group consisting of silver, gold, copper, palladium, indium-tin oxide, or combinations thereof.

24. The method of claim 20, wherein the printable material composition comprises a print material that comprises a silver salt.

25. The method of claim 20, wherein the printable material composition comprises a print material that comprises nanoparticles of silver metal, and the elastomeric relief element is a flexographic printing member.

* * * * *